(12) United States Patent
Watanabe (10) Patent No.: US 7,755,680 B2
(45) Date of Patent: Jul. 13, 2010

(54) IMAGE SIGNAL PROCESSOR AND DEFICIENT PIXEL DETECTION METHOD (75) Inventor: Tohru Watanabe, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 647 days.

(21) Appl. No.: 11/426,754

(22) Filed: Jun. 27, 2006

(65) Prior Publication Data
US 2006/0233431 A1 Oct. 19, 2006

Related U.S. Application Data (62) Division of application No. 09/696,393, filed on Oct. 25, 2000, now Pat. No. 7,092,018.

(30) Foreign Application Priority Data

Oct. 27, 1999 (JP) ............................. 11-305805
Oct. 28, 1999 (JP) ............................. 11-307125
Sep. 18, 2000 (JP) ............................. 2000-282166

(51) Int. Cl.
H04N 9/64 (2006.01)

(52) U.S. Cl. ..................................... 348/247

(58) Field of Classification Search ................ 348/246, 348/247, 241
See application file for complete search history.

(56) References Cited

U.S. PATENT DOCUMENTS 4,893,185 A 1/1990 Fukushima et al.
4,920,428 A * 4/1990 Lin et al. .................... 358/461
5,008,698 A 4/1991 Muramatsu et al.
5,185,883 A * 2/1993 Ianni et al. .................. 348/247
5,327,246 A * 7/1994 Suzuki ....................... 348/246
5,394,525 A 2/1995 Kuwana et al.
5,436,659 A 7/1995 Vincent (Continued)

FOREIGN PATENT DOCUMENTS

JP 07-023297 1/1995

(Continued)

OTHER PUBLICATIONS

Patent Abstracts of Japan, Publication No. 05-260385, Publication Date: Oct. 8, 1993, Title: "Defect Picture Element Detection Circuit for Solid-State Image Pickup Device".

(Continued)

Primary Examiner—Jason Chan
Assistant Examiner—Gary C Vieaux
(74) Attorney, Agent, or Firm—Fish & Richardson P.C.

(57) ABSTRACT

A deficiency candidate detection circuit detects a deficient pixel candidate by comparing the image signal of a target pixel with the image signals of peripheral pixels, and address information of the deficient pixel candidate is stored in a position memory circuit. A deficiency determining circuit repeats the determination of a deficient pixel a number of times based on the address information stored in the position memory circuit, and determines address information of a deficient pixel from the continuity of the determination results. A deficiency registering circuit registers the determined address information in the position memory circuit. A deficiency correction circuit corrects the image signal of the deficient pixel according to the registered address information of the deficient pixel.

9 Claims, 9 Drawing Sheets

U.S. PATENT DOCUMENTS

| | | | |
|---|---|---|---|
| 5,526,092 A | | 6/1996 | Iwasaki |
| 5,625,413 A | * | 4/1997 | Katoh et al. ............... 348/246 |
| 5,635,990 A | | 6/1997 | Yi |
| 5,805,216 A | | 9/1998 | Tabei et al. |
| 5,854,655 A | * | 12/1998 | Watanabe et al. ........... 348/247 |
| 5,982,946 A | | 11/1999 | Murakami |
| 6,002,433 A | | 12/1999 | Watanabe et al. |
| 6,034,724 A | | 3/2000 | Nakamura |
| 6,381,357 B1 | | 4/2002 | Tan et al. |
| 6,509,927 B1 | | 1/2003 | Prater et al. |
| 6,642,960 B1 | | 11/2003 | Kohashi et al. |
| 6,683,643 B1 | * | 1/2004 | Takayama et al. ........... 348/247 |
| 6,765,614 B1 | * | 7/2004 | Matsukawa ................ 348/246 |
| 6,768,513 B1 | * | 7/2004 | Watanabe et al. ........... 348/246 |

FOREIGN PATENT DOCUMENTS

| | | |
|---|---|---|
| JP | 08-317292 | 11/1996 |
| JP | 09-205586 | 8/1997 |
| JP | 11-183323 | 7/1999 |
| KR | 9703744 | 3/1997 |

OTHER PUBLICATIONS

Korean Publication No. 1999-0041744, filed Nov. 24, 1997, Applicant: LG Electronics, Inc., Seoul, Korea.

Action and Response History retrieved from PAIR for U.S. Appl. No. 11/426,759, through Jan. 23, 2009.

Action and Response History retrieved from PAIR for U.S. Appl. No. 11/426,759, through Jun. 30, 2009.

Notification of Reasons for Rejection dated Aug. 28, 2006 with English translation for counterpart Japanese Application No. 2006-002720, 4 pages, corresponding to U.S. Appl. No. 11/426,729.

Amendment filed on Nov. 2, 2006 for Japanese Patent Application No. 2006-002720 with English translation, 4 pages, corresponding to U.S. Appl. No. 11/426,759.

Decision of Rejection dated Jul. 11, 2007 with English translation for counterpart Japanese Application No. 2006-002720, 4 pages, corresponding to U.S. Appl. No. 11/426,759.

Notification of Reasons for Rejection dated Aug. 28, 2006 with English translation for counterpart Japanese Application No. 2006-002721, 4 pages, corresponding to U.S. Appl. No. 11/426,754.

Amendment filed on Nov. 2, 2006 for Japanese Patent Application No. 2006-002721 with English translation, 5 pages, corresponding to U.S. Appl. No. 11/426,754.

Decision of Rejection dated Jul. 12, 2007 with English translation for counterpart Japanese Application No. 2006-002721, 4 pages, corresponding to U.S. Appl. No. 11/426,754, corresponding to U.S. Appl. No. 11/426,754.

Amendment filed on Sep. 6, 2007 for Japanese Patent Application No. 2006-002721 with English translation, 5 pages, corresponding to U.S. Appl. No. 11/426,754.

* cited by examiner

IMAGE SIGNAL PROCESSOR AND DEFICIENT PIXEL DETECTION METHOD

RELATED APPLICATIONS

This application is a divisional and claims the benefit of priority under 35 USC 120 of U.S. application Ser. No. 09/696,393, filed Oct. 25, 2000, now U.S. Pat. No. 7,092,018, issued Aug. 15, 2006. Under the 35 USC 119, the Ser. No. 09/696,393 application claims the benefit of three foreign priority applications filed in Japan, serial number 2000-282166, filed Sep. 18, 2000; serial number 11-305805, filed Oct. 27, 1999; serial number 11-307125, filed Oct. 28, 1999. The disclosure of the prior applications are considered part of and are incorporated by reference in the disclosure of this application.

BACKGROUND OF THE INVENTION

The present invention relates to an image signal processor, and, more particularly, to an image signal processor and a deficient pixel detection method which detect a deficiency contained in image signals and correct the deficiency.

Solid state image pickup devices, such as CCD image sensors, may store a constant charge in a pixel regardless of the level of the received light. As a result, the pixel becomes a deficient pixel and outputs an image signal of a fixed level.

To eliminate the influence of deficient pixels on an image reproduction screen, deficiency correction is performed on the image signals of deficient pixels acquired from the solid stat image pickup device.

Figure 1:
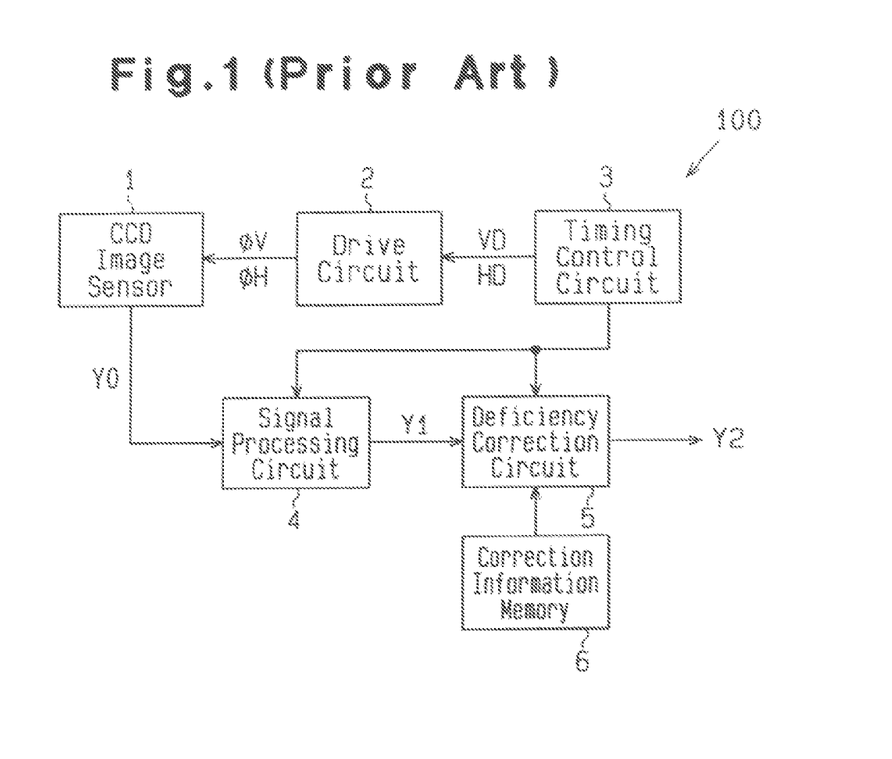
FIG. 1 is a schematic block diagram of a conventional solid state image pickup device.

FIG. 1 is a schematic block diagram of an image pickup device 100. The pickup device 100 has a CCD image sensor 1, a drive circuit 2, a timing control circuit 3, a signal processing circuit 4, a deficiency correction circuit 5 and a correction information memory 6.

The CCD image sensor 1 has a matrix of light receiving pixels (not shown) which store charges according to the received image of a subject. The CCD image sensor 1 transfers charges stored in the individual light receiving pixels line by line in accordance with a vertical drive signal $\Phi V$ and a horizontal drive signal $\Phi H$, and produces an image signal Y0 according to a predetermined format.

The drive circuit 2 produces the vertical drive signal $\Phi V$ and horizontal drive signal $\Phi H$ for driving the CCD image sensor 1 in accordance with a vertical sync signal VD and a horizontal sync signal HD, and sends those drive signals to the CCD image sensor 1.

The timing control circuit 3 frequency-divides a reference clock having a given period to thereby produce the vertical sync signal VD that determines the vertical scan timing and the horizontal sync signal HD that determines the horizontal scan timing, and sends the sync signals VD and HD to the drive circuit 2. In the NTSC format, for example, the horizontal sync signal HD is produced by frequency-dividing a reference clock of 14.32 MHz by 910, and the vertical sync signal VD is produced by frequency-dividing the horizontal sync signal by 525/2. The timing control circuit 3 supplies the signal processing circuit 4 and the deficiency correction circuit 5 with a timing signal synchronous with the operational timing of the CCD image sensor 1.

The signal processing circuit 4 performs a sample and hold process and level correction on the image signal Y0 supplied from the CCD image sensor 1, thereby generating an image signal Y1. The image signal Y0 repeats a signal level and reset level. In the sample and hold process, the signal processing circuit 4 produces the image signal Y1 having the signal level from the image signal Y0 by clamping the reset level, for example. In the level correction, the signal processing circuit 4 performs gain feedback control on the image signal Y0 in such a manner that the average level of the image signal Y1 lies in a target range. The signal processing circuit 4 samples and holds the image signal Y0 and performs A/D conversion on the resultant image signal Y0, thus yielding a digital image signal Y1.

The deficiency correction circuit 5 adjusts the image signal Y1 using correction information stored in the correction information memory 6. For instance, information of a deficient pixel is replaced with the average value of information of pixels before and after the deficient pixel.

The correction information memory 6 stores the positions of deficient pixels of the CCD image sensor 1. For example, the positions of deficient pixels are detected by monitoring the output of the CCD image sensor 1 beforehand, and the detection result is stored as correction address information in the memory 6.

Even when plural CCD image sensors 1 are constructed from semiconductor substrates that have been manufactured with the same process, the positions of deficient pixels differ from one sensor to another. It is therefore necessary to generate correction address information by detecting the positions of deficient pixels for each CCD image sensor 1. This increases the cost involved in the assembling process.

The number of deficient pixels in the CCD image sensor 1 may increase with time. When such time-dependent changes occur, the correction address information in the correction information memory 6 should be rewritten. However, ordinary users of image pickup devices do not have means for rewriting the contents of the correction information memory 6. This makes it harder to rewrite the correction address information.

SUMMARY OF THE INVENTION

Accordingly, it is an objective of the present invention to provide a low-cost image signal processor capable of coping with deficient pixels in an image pickup device as time passes.

To achieve this objective, according to a first aspect of this invention, there is provided an image signal processor for processing a plurality of image signals. The image signal processor comprises an image memory circuit for storing a signal corresponding to a target pixel and signals corresponding to a plurality of peripheral pixels adjacent to the target pixel. The image signal processor further comprises a deficiency candidate detection circuit, connected to the image memory circuit, for comparing the signal of the target pixel with a threshold value set in accordance with the signals of the plurality of peripheral pixels to hereby detect a deficient pixel candidate. Also provided is a deficiency determining circuit, connected to the deficiency candidate detection circuit, for determining a deficient pixel according to continuity of the deficient pixel candidate, detected by the deficiency candidate detection circuit, over a plurality of screens. A position memory circuit, connected to the deficiency determining circuit, stores deficiency information of a position of the deficient pixel determined by the deficiency determining circuit. Finally, a deficiency correction circuit, connected to the position memory circuit, corrects the signal of the target pixel which is deficient in accordance with the deficiency information.

According to a second aspect of this invention, there is provided a method of detecting a deficient pixel in a plurality of pixels. The method comprises the steps of: detecting a deficient pixel candidate by comparing a signal of a target pixel with a threshold value set in accordance with signals of a plurality of peripheral pixels adjacent to the target pixel; storing a position of the detected deficient pixel candidate; recomparing a signal of that target pixel which corresponds to the position stored in the position storing step with the threshold value; storing a comparison result of the recomparing step; repeating the recomparing step and the comparison result storing step a predetermined number of times; and detecting a deficient pixel in accordance with a plurality of comparison results obtained from the repeating step.

According to a third aspect of this invention, there is provided a method of detecting a deficient pixel in a plurality of pixels. The method comprises the steps of: detecting a first deficient pixel candidate by comparing a signal of a target pixel with a threshold value set in accordance with signals of a plurality of peripheral pixels adjacent to the target pixel; storing a position of the first deficient pixel candidate; detecting a second deficient pixel candidate by comparing a signal of the target pixel with the threshold value; determining if a position of the first deficient pixel candidate coincides with a position of the second deficient pixel candidate; updating information of the stored position of the first deficient pixel candidate in such a way that only position information of that first deficient pixel candidate which has been determined to have a match in the coincidence determining step remains; repeating the second-deficient-pixel-candidate detecting step, the coincidence determining step and the updating step a predetermined number of times; and detecting a deficient pixel in accordance with position information of deficient pixel candidates acquired from the repeating step.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are distinctly set forth in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

First Embodiment

Figure 2:
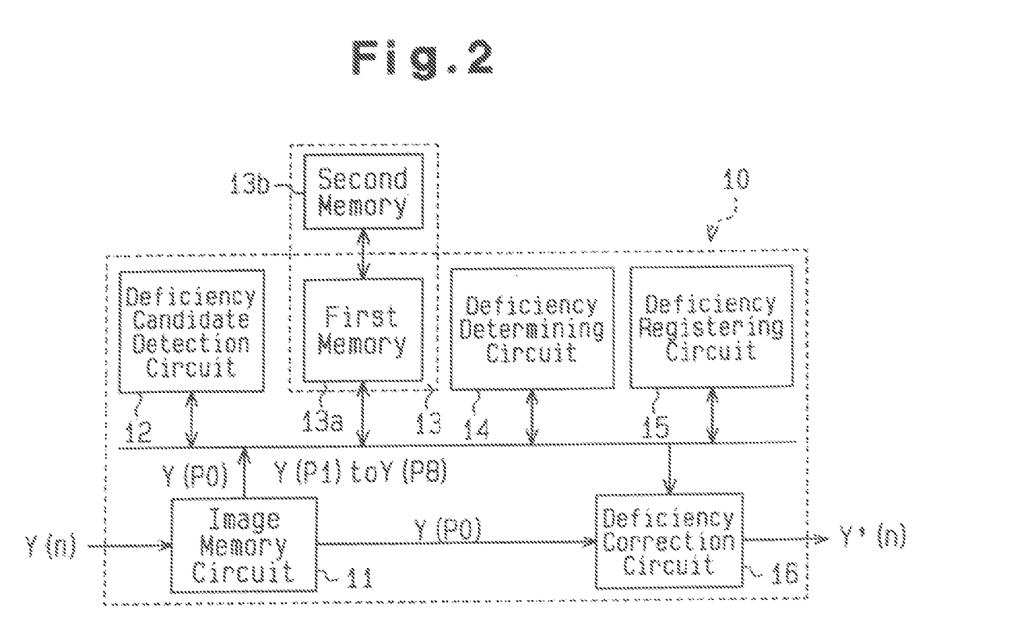
FIG. 2 is a schematic block diagram of an image signal processor according to a first embodiment of the invention.

FIG. 2 is a schematic block diagram of an image signal processor 10 according to the first embodiment of the invention. This image signal processor 10 is adapted for use in a solid state image pickup device.

As shown in FIG. 2, the image signal processor 10 has an image memory circuit 11, a deficiency candidate detection circuit 12, a position memory circuit 13, a deficiency determining circuit 14, a deficiency registering circuit 15 and a deficiency correction circuit 16. In an image pickup device, a digital image signal Y(n) is produced by performing a predetermined process on the output signal of the image pickup element and then performing A/D conversion on the processed signal. The image signal processor 10 performs correction on the image signal Y(n) of a deficient pixel.

Figure 3:
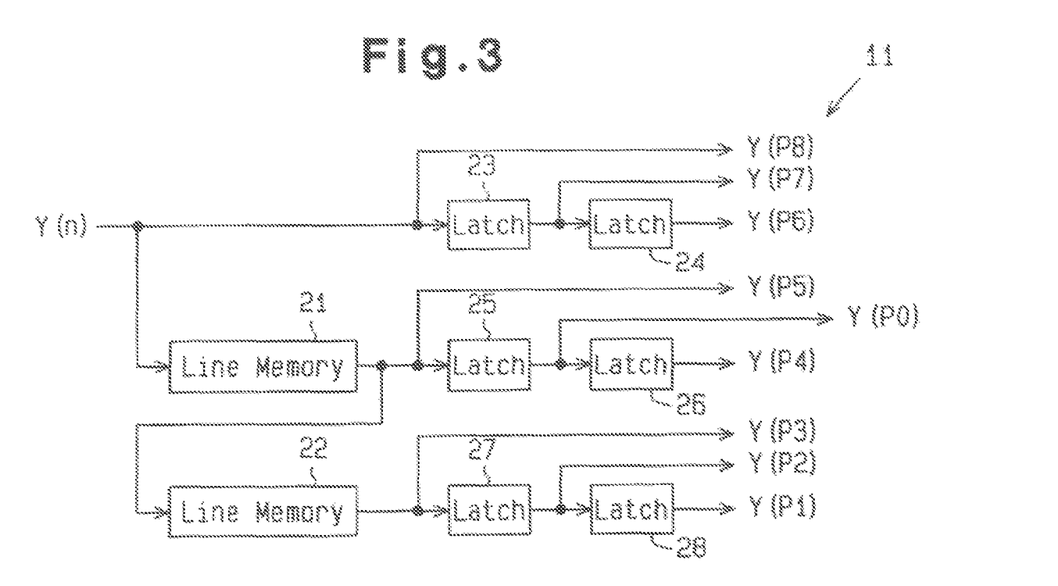
FIG. 3 is a schematic block diagram of an image memory circuit in the image signal processor in FIG. 2.

The image memory circuit 11 has a plurality of line memories 21 and 22 and a plurality of latches 23 to 28 (see FIG. 3). The image memory circuit 11 fetches image signals Y(n) line by line and simultaneously generates an image signal Y(P0) corresponding to a target pixel P0 and image signals Y(P1) to Y(P8) corresponding to its peripheral pixels P1 to P8 (see FIG. 4).

The deficiency candidate detection circuit 12 generates a first threshold value Lw for determining a white deficiency and a second threshold value Lb for determining a black deficiency from the image signals Y(P1) to Y(P8) of the peripheral pixels P1-P8 supplied from the image memory circuit 11. The deficiency candidate detection circuit 12 compares the first and second threshold values Lw and Lb with the image signal Y(P0) to detect a pixel which is a possible deficient pixel (hereinafter referred to as "deficiency candidate").

The deficiency candidate detection circuit 12 detects a real deficient pixel, which is due to a physical deficiency of the solid state image pickup device, and an apparent deficient pixel, which is considered as an accidental deficient pixel due to some reasons related to the subject itself, and being unidentifiable. The deficiency candidate detection circuit 12 outputs address information which indicates the position of a deficient pixel. For example, the number of pixels is counted in synchronism with the image signals Y(n) and the count value when a deficient pixel is detected is output as address information.

The position memory circuit 13 includes a volatile first memory 13a, such as a static memory (SRAM), capable of operating fast and a non-volatile second memory 13b, such as a programmable memory (EEPROM). The position memory circuit 13 stores pixel position information indicating address information supplied from the deficiency candidate detection circuit 12 and deficiency determining circuit 14.

The first memory 13a stores address information which is temporarily generated in the process of determining a deficient pixel. The second memory 13b stores address information of a pixel which is finally confirmed to be a deficient pixel through the deficient-pixel determining process.

The deficiency determining circuit 14 determines whether a pixel corresponding to the address stored in the position memory circuit 13 is a real deficient pixel or not, based on the continuity of a deficiency candidate over a plurality of screens. Specifically, when a deficient pixel is accidentally detected because of some reasons on the subject side, i.e., related to the subject, the deficient pixel will not be detected after a certain time passes. When a deficient pixel is detected continuously over a predetermined time period, therefore, the deficiency determining circuit 14 determines a real deficient pixel.

As the pixel at the address stored in the position memory circuit 13 is continuously determined to be a deficiency candidate over a plurality of screens by the deficiency candidate detection circuit 12, the continuity of the deficient pixel is judged. Alternatively, the continuity of a deficient pixel is judged by comparing address information indicating deficiency candidates obtained for the individual screens with one another while continuously operating the deficiency candidate detection circuit 12 over a plurality of screens. When the detection operation of the deficiency determining circuit 14 is the same as the detection operation of the deficiency candidate detection circuit 12, part of the deficiency candidate detection circuit 12 may be shared.

The deficiency registering circuit 15 supplies the position memory circuit 13 with address information of the pixel that has been determined as a real deficient pixel by the deficiency determining circuit 14.

The deficiency correction circuit 16 replaces the image signal Y(P0) of the deficient pixel with a correction signal Y(c) in accordance with the address information which is stored in the position memory circuit 13 by the deficiency registering circuit 15. The correction signal Y(c) is produced by, for example, averaging the image signals of a plurality of peripheral pixels located around the target pixel. As a result, the deficiency correction circuit 16 outputs an image signal Y'(n) with corrected white and black deficiencies.

In the detection of a deficient pixel, each of the first and second threshold values Lw and Lb may be separated into a plurality of sub-threshold values so that a deficient pixel candidate is weighted using the sub-threshold values. The noticeability of a deficient pixel which deviates significantly from the predetermined first and second threshold values Lw and Lb differs from the noticeability of a deficient pixel which deviates slightly from the threshold values. The deficiency candidate detection circuit 12 determines the level of a deficient pixel (signal) using the sub-threshold values and stores the level of the deficient pixel in the position memory circuit 13. If the number of deficient pixels which can be registered in the position memory circuit 13 is limited, the deficiency registering circuit 15 can register the levels of those pixels which have highly deficient pixel levels by priority. If the position memory circuit 13 has no more space for registering the level of a new deficient pixel, the deficiency registering circuit 15 compares the deficient level of a pixel to be newly registered with that of a pixel already registered and rewrites information of a deficient pixel in accordance with the comparison result. This allows a deficient pixel which is more noticeable on the screen to be corrected with priority.

The individual circuits of the image signal processor 10 will be discussed in detail below.

FIG. 3 is a schematic block diagram of the image memory circuit 11. As mentioned earlier, the image memory circuit 11 includes the first and second line memories 21 and 22 and the first to sixth latches 23 to 28.

The line memories 21 and 22 are connected in series. The image signals Y(n) are written in the first line memory 21 and the image signals Y(n) that are sequentially read from the first line memory 21 are written in the second line memory 22. With respect to sequentially supplied image signals Y(n), the image signals Y(n) of the preceding line are read from the first line memory 21 and the image signals Y(n) of the line before the preceding one are read from the second line memory 22.

The first and second latches 23 and 24 are connected in series. The image signal Y(n) of the pixel preceding the present one is latched in the first latch 23, and the image signal Y(n) of the pixel just before the preceding one is latched in the second latch 24. As shown in FIG. 3, the image memory circuit 11 outputs the image signal Y(n) as the image signal Y(P8) corresponding to the peripheral pixel P8, and the first and second latches 23 and 24 respectively output the image signals Y(P7) and Y(P6) corresponding to the peripheral pixels P7 and P6.

The third and fourth latches 25 and 26 are connected in series to the first line memory 21. The image signal Y(n) of the pixel that is located one line and one pixel before the present one is latched in the third latch 25, and the image signal Y(n) of the pixel that is located one line and two pixels before the present one is latched in the fourth latch 26. Therefore, the first line memory 21 outputs the image signal Y(P5) corresponding to the peripheral pixel P5, and the third and fourth latches 25 and 26 respectively output the image signal Y(P0) corresponding to the target pixel P0 and the image signal Y(P4) corresponding to the peripheral pixel P4.

Likewise, fifth and sixth latches 27 and 28 are connected in series to the second line memory 22. The image signal Y(n) of the pixel that is located two lines and one pixel before the present one is latched in the fifth latch 27, and the image signal Y(n) of the pixel that is located two lines and two pixels before the present one is latched in the sixth latch 28. Therefore, the second line memory 22 outputs the image signal Y(P3) corresponding to the peripheral pixel P3, and the fifth and sixth latches 27 and 28 respectively output the image signals Y(P2) and Y(P1) corresponding to the peripheral pixels P2 and P1.

The image memory circuit 11 generates the image signal Y(P0) of the target pixel P0 and the image signals Y(P1)-Y(P8) of the peripheral pixels P1-P8, located around the target pixel P0, in parallel from the image signal Y(n).

Figure 5:
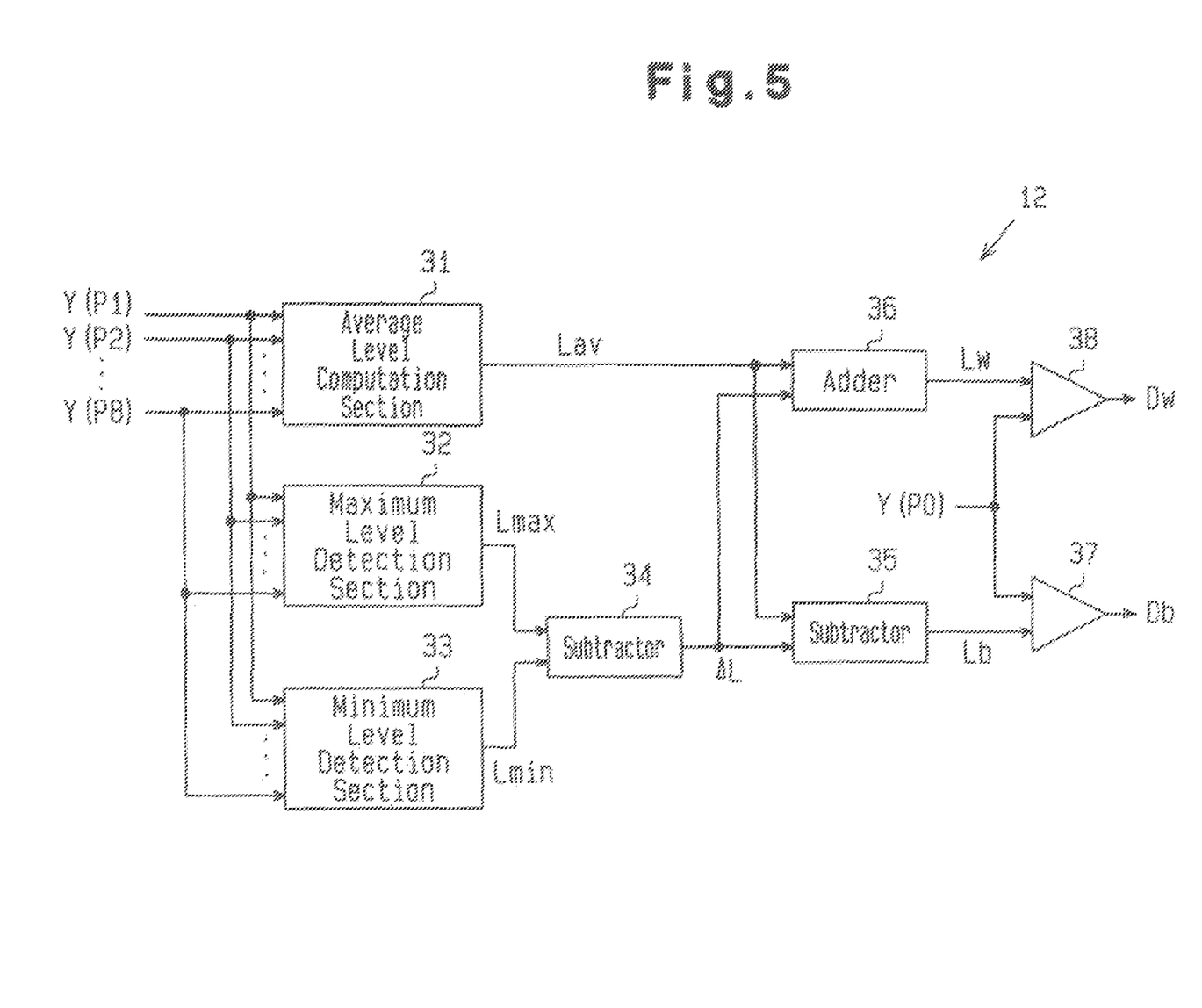
FIG. 5 is a schematic block diagram of a deficiency candidate detection circuit in the image signal processor in FIG. 2.

FIG. 5 is a schematic block diagram of the deficiency candidate detection circuit 12. The deficiency candidate detection circuit 12 has an average level computation section 31, a maximum level detection section 32, a minimum level detection section 33, first and second subtractors 34 and 35, an adder 36, and first and second comparators 37 and 38.

The average level computation section 31 fetches the image signals Y(P1)-Y(P8) of the peripheral pixels P1-P8 and calculates an average level Lav.

The maximum level detection section 32 detects a maximum level Lmax in the levels of the image signals Y(P1)-Y(P8), and the minimum level detection section 33 detects a minimum level Lmin.

The first subtractor 34 subtracts the minimum level Lmin, supplied from the minimum level detection section 33, from the maximum level Lmax supplied from the maximum level detection section 32 to thereby compute a level difference ΔL.

The adder 36 adds the level difference ΔL to the average level Lav supplied from the average level computation section 31 to thereby generate a first threshold value Lw for determining a white deficiency.

The second subtractor 35 subtracts the level difference ΔL from the average level Lav supplied from the average level computation section 31 to thereby generate a second threshold value Lb for determining a black deficiency.

The first comparator 37 compares the second threshold value Lb from the second subtractor 35 with the image signal Y(P0) of the target pixel P0, and generates and H-level detection signal Db when the level of the image signal Y(P0) has not reached the threshold value Lb. That is, the first comparator 37 generates the H-level detection signal Db when the target pixel P0 is determined to have a black deficiency.

The second comparator 38 compares the first threshold value Lw from the adder 36 with the image signal Y(P0) of the target pixel P0, and generates an H-level detection signal Dw when the level of the image signal Y(P0) exceeds the threshold value Lw. That is, the second comparator 38 generates the H-level detection signal Dw when the target pixel P0 is determined to have a white deficiency.

Figure 6:
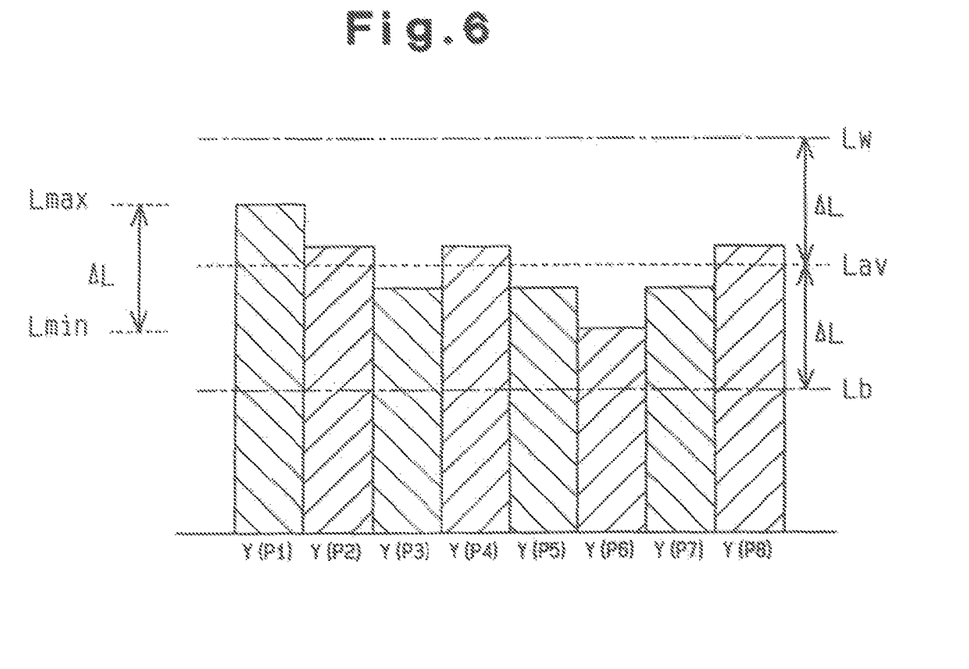
FIG. 6 is a diagram showing the relationship between a threshold value and the levels of peripheral pixels.
Figure 7:
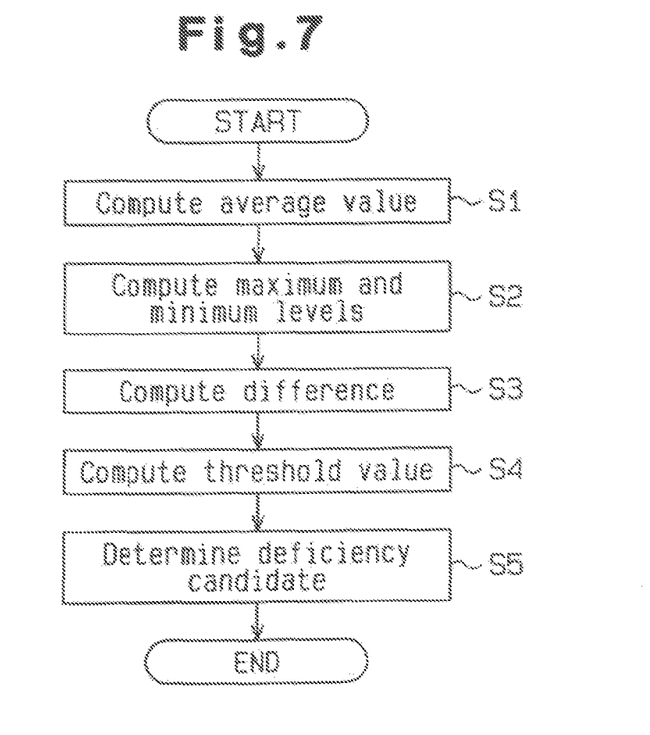
FIG. 7 is a flowchart for explaining the operation of a deficiency determining circuit.

FIG. 6 shows the relationship between the levels of image signals representing the peripheral pixels located around a target pixel and the threshold value that is computed by using those image signals. FIG. 7 is a flowchart illustrating procedures of a deficiency candidate determining routine which is performed by the deficiency candidate detection circuit 12.

Figure 4:
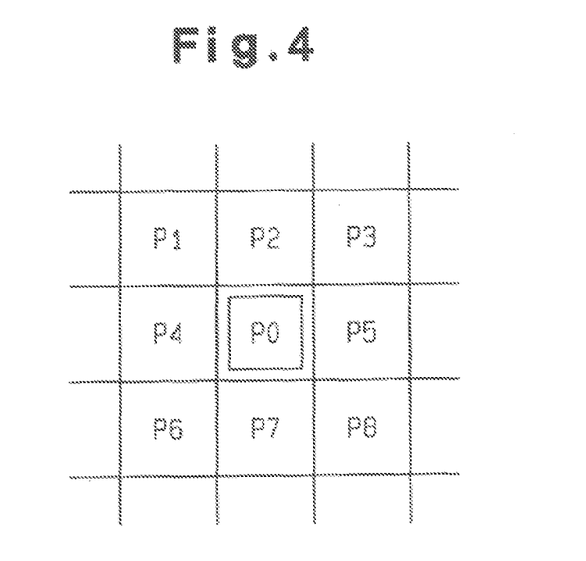
FIG. 4 is a schematic plan view of pixels showing the positional relationship between a target pixel and peripheral pixels.

The deficiency candidate determining routine according to the first embodiment determines whether the target pixel P0 has a deficiency or not by referring to the eight peripheral pixels P1-P8 adjacent to the target pixel P0, as shown in FIG. 4.

In step S1 in FIG. 7, the average level computation section 31 calculates the average level Lav of the image signals Y(P1)-Y(P8) for eight peripheral pixels P1-P8.

In step S2, the maximum level detection section 32 and minimum level detection section 33 detect the maximum level Lmax and minimum level Lmin of the image signals Y(P1)-Y(P8). The first step S1 and second step S2 may be carried out in any order.

In step S3, the first subtractor 34 subtracts the minimum level Lmin from the maximum level Lmax to thereby compute the level difference ΔL.

In step S4, the second subtractor 35 subtracts the level difference ΔL from the average level Lav, thereby generating the second threshold value Lb for determining a black deficiency. The adder 36 adds the level difference ΔL to the average level Lav, thereby generating the first threshold value Lw for determining a white deficiency.

In step S5, the first and second comparators 37 and 38 compare the second and first threshold values Lb and Lw with the image signal Y(P0) to determine a candidate for a deficient pixel, and respectively generate the detection signals Db and Dw.

The first threshold value Lw and second threshold value Lb that have been generated through the first to fifth steps S1-S5 are hold fixed according to the conditions of the peripheral pixels.

The first and second threshold values Lw and Lb approach the average level Lav when the level difference ΔL of the peripheral pixels is small and deviate from the average level Lav when the level difference ΔL is large. Therefore, the range of the first and second threshold values Lw and Lb becomes narrower in a pixel area whose contrast difference on the screen is small whereas the range of the threshold values Lw and Lb becomes wider in a pixel area whose contrast difference on the screen is large. Therefore, a visually noticeable deficient pixel (deficiency candidate) in each pixel area is detected efficiently.

Figure 8:
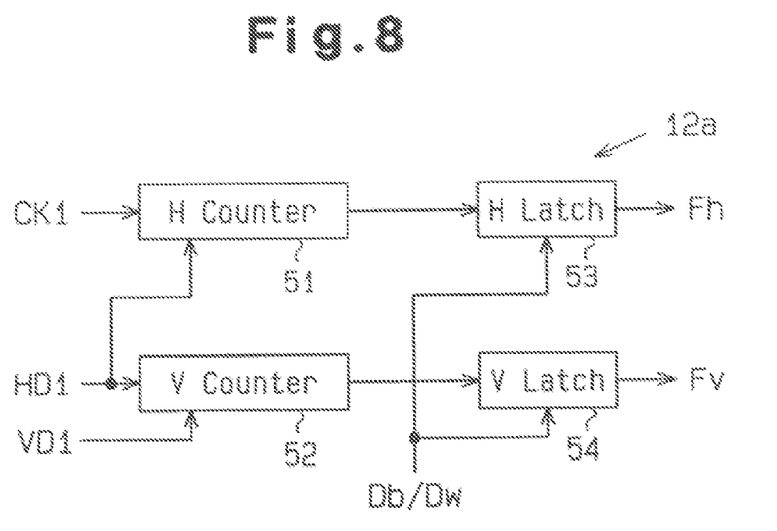
FIG. 8 is a schematic block diagram of an address generator in the image signal processor in FIG. 2.

FIG. 8 is a schematic block diagram of an address generator 12a in the deficiency candidate detection circuit 12, which generates the pixel address information of a deficiency candidate.

The address generator 12a has a horizontal counter 51, a vertical counter 52, a horizontal data latch 53 and a vertical data latch 54.

The horizontal counter 51 is reset in accordance with a horizontal sync signal HD1 and performs a count-up operation according to a clock CK1 which is synchronous with the detection operation of the deficiency candidate detection circuit 12. The horizontal counter 51 counts horizontal pixel numbers by repeatedly counting one line of pixels in each horizontal scan period.

The vertical counter 52 is reset in accordance with a vertical sync signal VD1 and performs a count-up operation according to the horizontal sync signal HD1. The vertical counter 51 counts vertical pixel numbers by repeatedly counting one screen of horizontal scan lines in each vertical scan period.

The horizontal data latch 53, connected to the horizontal counter 51, fetches the count value of the horizontal counter 51 in response to one of the detection signals Db and Dw. When one of the detection signals Db and Dw rises, for example, the horizontal data latch 53 outputs a horizontal address signal Fh. The horizontal address signal Fh indicates the horizontal position of the pixel that has been detected by the deficiency candidate detection circuit 12.

The vertical data latch 54, connected to the vertical counter 52, fetches the count value of the vertical counter 52 in response to one of the detection signals Db and Dw. When one of the detection signals Db and Dw rises, for example, the vertical data latch 54 outputs a vertical address signal Fv. The vertical address signal Fv indicates the vertical position of the pixel that has been detected by the deficiency candidate detection circuit 12.

Figure 9:
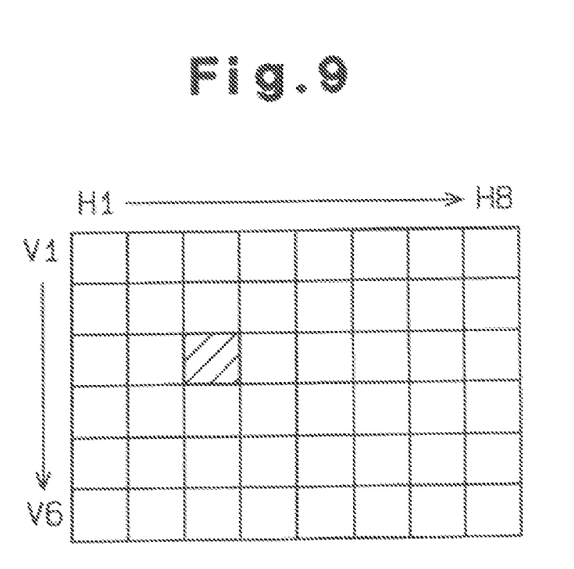
FIG. 9 is a schematic plan view of pixels for explaining the address of a deficient pixel on the screen.

When the screen has pixels of 6 rows by 8 columns as shown in FIG. 9, for example, the horizontal counter 51 repeats counting in the range of "1" to "8" and the vertical counter 52 repeats counting in the range of "1" to "6". If there is a possible deficient pixel at the third row and the third column, the horizontal data latch 53 outputs the horizontal address signal Fh of "3" in response to the rising of the detection signal Db or Dw. In response to the rising of the detection signal Db or Dw, the vertical data latch 54 outputs the vertical address signal Fv of "3". The address signals Fh and Fv indicate the address of the possible deficient pixel and are supplied to the deficiency determining circuit 14.

Figure 10:
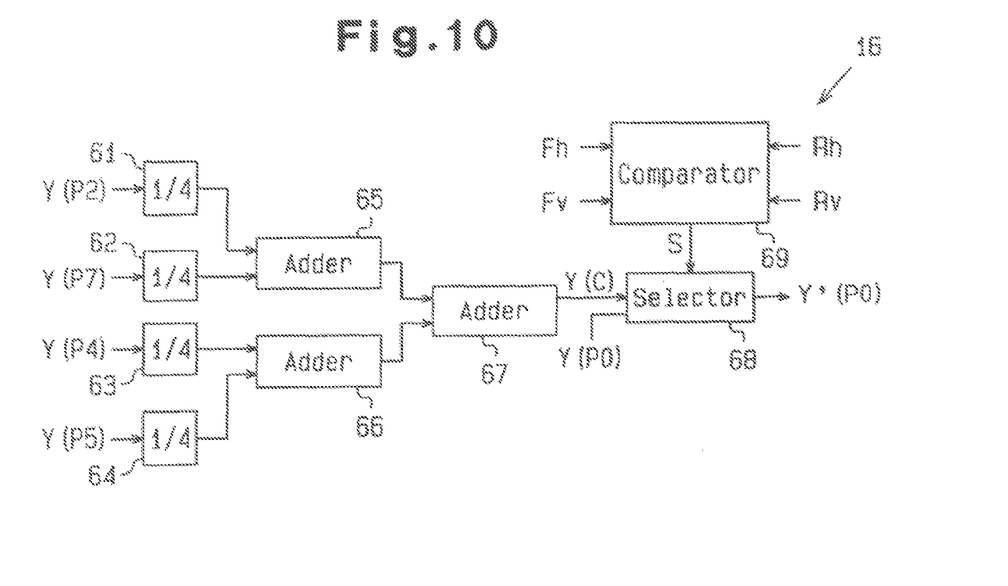
FIG. 10 is a schematic block diagram of a deficiency correction circuit in the image signal processor in FIG. 2.

FIG. 10 is a schematic block diagram of the deficiency correction circuit 16.

The deficiency correction circuit 16 has first to fourth subtractors 61 to 64, first to third adders 65 to 67, a selector 68 and a comparator 69.

The deficiency correction circuit 16 generates the correction signal Y(c) using the image signals Y(P2) and Y(P7) of the peripheral pixels P2 and P7 located above and below the target pixel P0 and the image signals Y(P4) and Y(P5) of the peripheral pixels P4 and P5 located left and right to the target pixel P0.

The first to fourth subtractors 61-64 respectively divide the image signals Y(P2), Y(P7), Y(P4) and Y(P5) supplied from the image memory circuit 11 by "4".

The first adder 65 adds the subtractions results from the first and second subtractors 61 and 62 and the second adder 66 adds the subtractions results from the third and fourth subtractors 63 and 64.

The third adder 67 adds the addition result from the first adder 65 to the addition result from the second adder 66, thereby generating the correction a signal Y(c).

The selector 68 selects higher the image signal Y(P0) or the correction signal Y(c) in response to a select control signal S supplied from the comparator 69. When the correction signal Y(c) is selected, the selector 68 outputs an image signal Y'(P0) obtained by correcting the image signal of the deficient pixel.

The comparator 69 compares the horizontal address signal Fh and vertical address signal Fv stored in the position memory circuit 13 with horizontal reference information Rh and vertical reference information Rv, which change in synchronicity with the horizontal scan. The comparator 69 generates the select control signal S when the horizontal address signal Fh matches with horizontal reference information Rh and the vertical address signal Fv matches with the vertical reference information Rv. The horizontal reference information Rh and vertical reference information Rv can be generated by suing the horizontal counter 51 and vertical counter 52 of the address generator 12a shown in FIG. 8.

When the horizontal address signal Fh and vertical address signal Fv respectively coincide with the horizontal reference information Rh and vertical reference information Rv, therefore, the selector 68 replaces the image signal Y(P0) of the target pixel P0 with the correction signal Y(c). As a result, the image signal of the deficient pixel is corrected by the information from its peripheral pixels.

Second Embodiment

Figure 11:
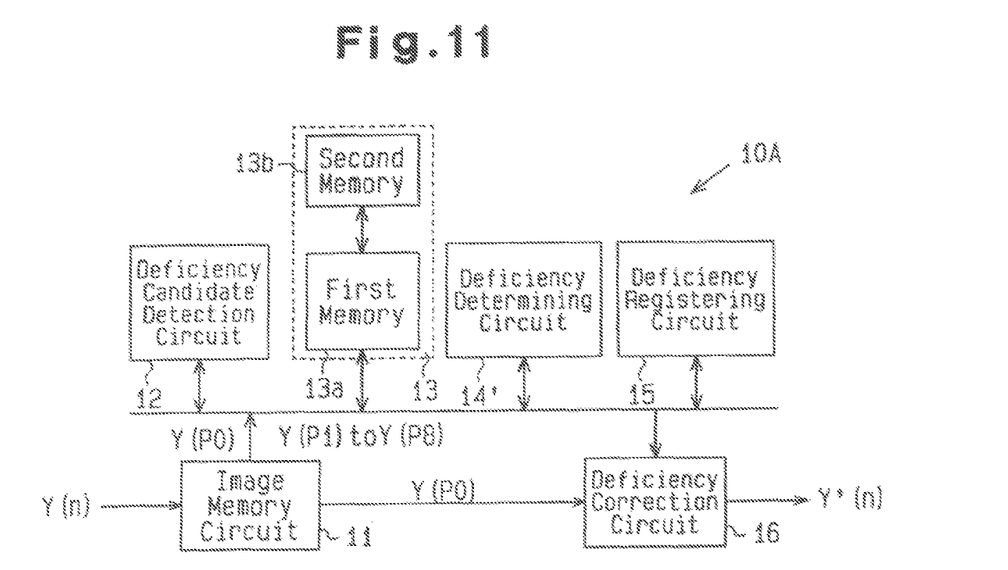
FIG. 11 is a schematic block diagram of an image signal processor according to a second embodiment of the invention.

FIG. 11 is a schematic block diagram of an image signal processor 10A according to the second embodiment of the invention.

The image signal processor 10A of the second embodiment determines a deficiency of a target pixel using the image pickup conditions of the image pickup device that generates image signals Y(n) in addition to the continuity of a deficient pixel.

A deficiency determining circuit 14A repeats determination on deficient pixels in accordance with the address information of deficiency candidates stored in the position memory circuit 13, thereby updating the address information. In the determination of a deficiency candidate, for instance with the deficiency candidate detection circuit 12, the deficiency determining circuit 14A determines a deficient pixel, receives information indicating the operational state of the image pickup device and changes the threshold level for determination according to the information.

When the luminance of the image of the subject is relatively high, a white deficiency is not noticeable. When the luminance of the image of the subject is relatively low, on the other hand, a black deficiency is not noticeable. If determination of a deficient pixel is executed based merely on the level of the image signal Y(n), therefore, a real deficient pixel may not be determined properly. To avoid such an inconvenience, in accordance with the image pickup conditions, such as exposure control information E(m) indicating the operational state of the image pickup device and gain control information G(m), the deficiency determining circuit 14A changes the threshold level for a deficient pixel, or temporarily stops determining a deficient pixel depending on the condition of the subject. For instance, the deficiency determining circuit 14A estimates the luminance of the subject based on the exposure control information E(m) and gain control information G(m), stops determination of a white deficiency when the estimated subject's luminance exceeds a certain threshold level and stops determination of a black deficiency when the estimated subject's luminance has not reached a certain threshold level.

In addition to the exposure control information E(m) and gain control information G(m), information that is used in image pickup control in the image pickup device may be used in the determining operation. For instance, focus control information for controlling the focus of the optical system of the image pickup device may be used to initially determine a deficiency before the focus is set. There is a clear difference between a real deficient pixel and peripheral pixels even when the focus of the optical system of the image pickup device is not fixed. Therefore, making a deficiency determination before the focus is set can ensure a more accurate determination.

The deficiency determining circuit 14A may determine a deficient pixel using only the image signals Y(n) and may add control information, such as the exposure control information E(m) and gain control information G(m), to the address information that is acquired from the determination result. That is, it is possible to choose whether or not to execute correction at the time of correcting a deficient pixel, in accordance with the image pickup control information added to the address information.

Third Embodiment

Figure 12:
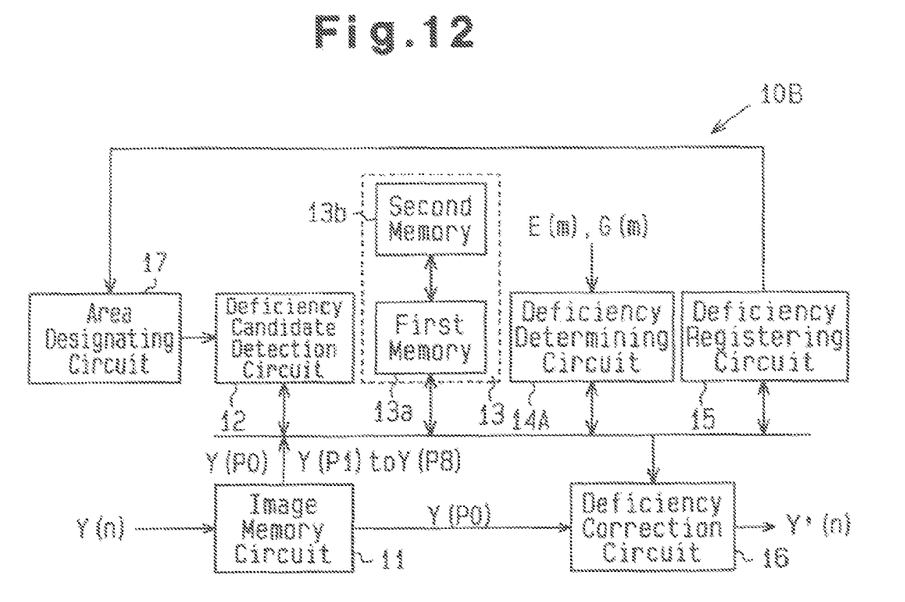
FIG. 12 is a schematic block diagram of an image signal processor according to a third embodiment of the invention.

FIG. 12 is a schematic block diagram of an image signal processor 10B according to the third embodiment of the invention. The image signal processor 10B of the third embodiment has an area designating circuit 17 in addition to the components of the image signal processor 10 of the first embodiment.

The image signal processor 10B limits the area of an image where the detection by the deficiency candidate detection circuit 12 is to be carried out. A deficiency determining circuit 14A, like that of the image signal processor 10A of the second embodiment, may determine a deficient pixel by using the image signals Y(n) and image pickup information of the image pickup device.

The area designating circuit 17 divides one screen into a plurality of sub-areas in synchronism with the horizontal scan timing and vertical scan timing of the image signals Y(n). The area designating circuit 17 controls the deficiency candidate detection circuit 12 in such a way that a deficiency candidate is detected for each sub-area. For example, the area designating circuit 17 divides the horizontal scan period by four and divides the vertical scan period by three, thereby separating one screen into 12 areas of 3 rows by 4 columns. The deficiency candidate detection circuit 12 performs deficiency detection for each sub-area.

The area designating circuit 17 changes a sub-area where detection of a deficient pixel is performed, in accordance with an instruction from the deficiency registering circuit 15. That is, when the address of a deficient pixel in one sub-area is fixed and the deficiency registering circuit 15 completes registration of the address information of the deficient pixel, the area designating circuit 17 changes the sub-area. Even when a deficient pixel is not detected in a sub-area and when the deficiency registering circuit 15 has not performed registration of a deficient pixel, a sub-area is changed when a predetermined deficiency detection process is completed. Accordingly, the deficiency candidate detection circuit 12 detects a deficient pixel for each sub-area on the screen.

The deficiency candidate detection circuit 12 detects more pixels than will finally be registered as deficient pixels. For temporary storage of the address of each detected pixel, therefore, the position memory circuit 13, particularly, the first memory 13*a*, needs a large capacity. As the deficiency candidate detection circuit 12 operates in a time-division multiplexed manner in the third embodiment, the capacity of the position memory circuit 13 is reduced.

Fourth Embodiment

Figure 13:
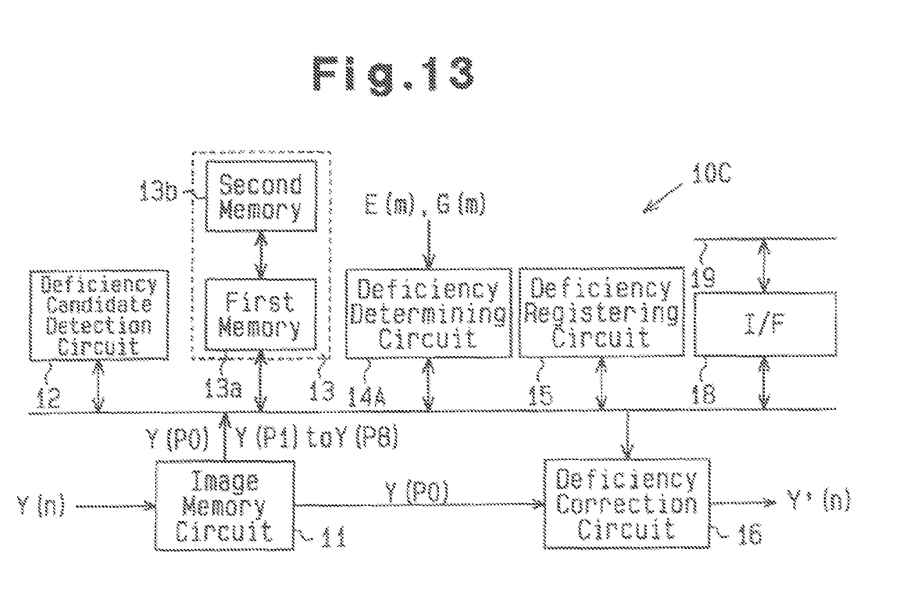
FIG. 13 is a schematic block diagram of an image signal processor according to a fourth embodiment of the invention.

FIG. 13 is a schematic block diagram of an image signal processor 10C according to the fourth embodiment of the invention. The image signal processor 10C of the fourth embodiment has an interface circuit 18 in addition to the components of the image signal processor 10 of the first embodiment.

The deficiency determining circuit 14A of the image signal processor 10C, like that of the image signal processor 10A in FIG. 11, may determine a deficient pixel by using the image signals Y(n) and image pickup information of the image pickup device. In addition, the area designating circuit 17 may also be provided.

The interface circuit 18 is connected to a serial bus 19 via which the image signal processor 10C is connected to an external computer (not shown). The computer changes address information stored in the position memory circuit 13 and the threshold level for determination by the deficiency determining circuit 14A through the interface circuit 18. For example, the computer chooses whether or not to use the exposure control information E(m) and gain control information G(m). If this information is to be used, it is supplied to the deficiency determining circuit 14A. When information E(m) and G(m) is used, the computer sets which information has a high priority, through the serial bus 19 and the interface circuit 18. The divisional method of the area designating circuit 17 is changed by the computer.

The interface circuit 18 may be connected directly to the deficiency determining circuit 14A and deficiency registering circuit 15.

A method of detecting a deficient pixel according to the invention will now be described.

Figure 14:
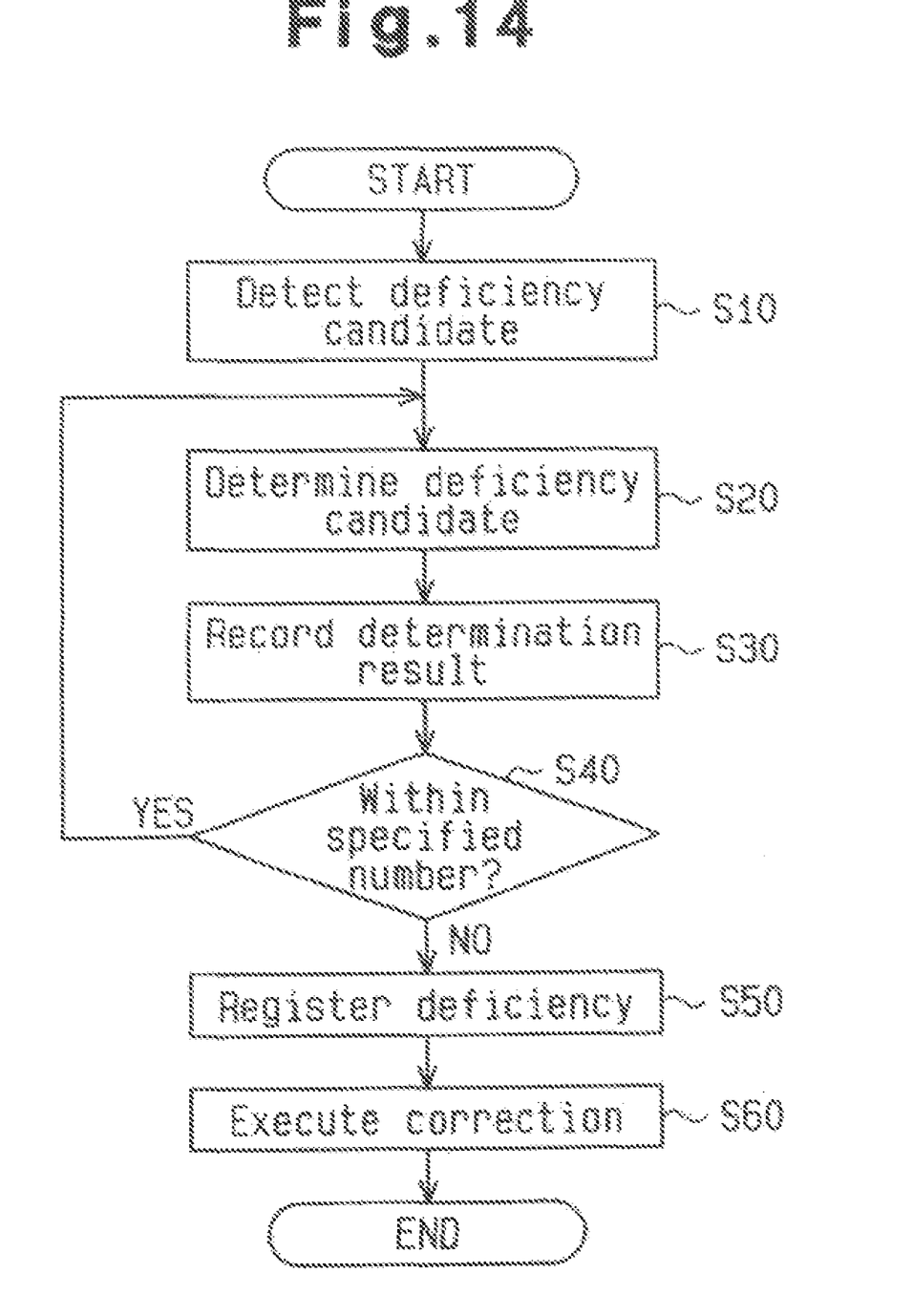
FIG. 14 is a flowchart for explaining a first deficient-pixel detection method according to the invention.

FIG. 14 is a flow chart for explaining a first deficient-pixel detection method according to the invention.

The first deficient-pixel detection method is executed by the deficiency candidate detection circuit 12, the position memory circuit 13, the deficiency determining circuit 14, the deficiency registering circuit 15 and the deficiency correction circuit 16 in the image signal processor 10 (10A, 10B or 10C).

In step S10 in FIG. 14, the deficiency candidate detection circuit 12 detects a candidate for a deficient pixel (see FIG. 7) with, for example, one screen of image signals taken as a unit. The address information that indicates the position of the deficiency candidate is stored in the position memory circuit 13.

In step S20, the deficiency determining circuit 14 performs a detecting operation (see FIG. 7) on the image signal Y(n) of the pixel that is designated by the address information stored in the position memory circuit 13 with, for example, the next screen of image signals taken as a unit.

In step S30, with regard to the pixel that has been determined as a deficiency candidate, the determination result is stored. For example, the number of times the target pixel is determined as a deficiency candidate is accumulated and recorded.

In step S40, it is determined whether the number of determination processes on a deficient pixel performed by the deficiency determining circuit 14 lies within a predetermined specified number or not. When the number of determination processes lies below the specified number, the processes of steps S20 and S30 are repeated until the former number reaches the specified number. Therefore, the deficiency determining circuit 14 performs determination on a deficiency candidate over a plurality of screens.

When the number of determination processes reaches within the specified number, on the other hand, the flow proceeds to step S50.

In step S50, the deficiency determining circuit 14 determines, as a real deficient pixel, the pixel which has been determined as a deficiency candidate some number of times greater than the threshold value.

The deficiency registering circuit 15 registers the address of the pixel that has been determined as a real deficiency candidate in the second memory 13*b* of the position memory circuit 13.

In step S60, the deficiency correction circuit 16 performs correction on the image signal of the pixel whose address has been registered in the position memory circuit 13, thereby generating the image signal Y'(n) with the deficiency corrected.

The process of steps S10 to S60 determine a deficient pixel from the conditions of pixels over a plurality of screens as well as from the conditions of one screen of pixels. This makes it possible to distinguish a real deficient pixel from an accidental deficient pixel which is due to the state of the subject.

The greater the number of times determination of a deficient pixel is performed, the longer the time needed for the determination but the more accurate the determination result would be. When the determination of a real deficient pixel in step S50 is executed by using various kinds of control information, such as the exposure control information E(m), gain control information G(m) and focus control information, the determination precision is further improved.

Figure 15:
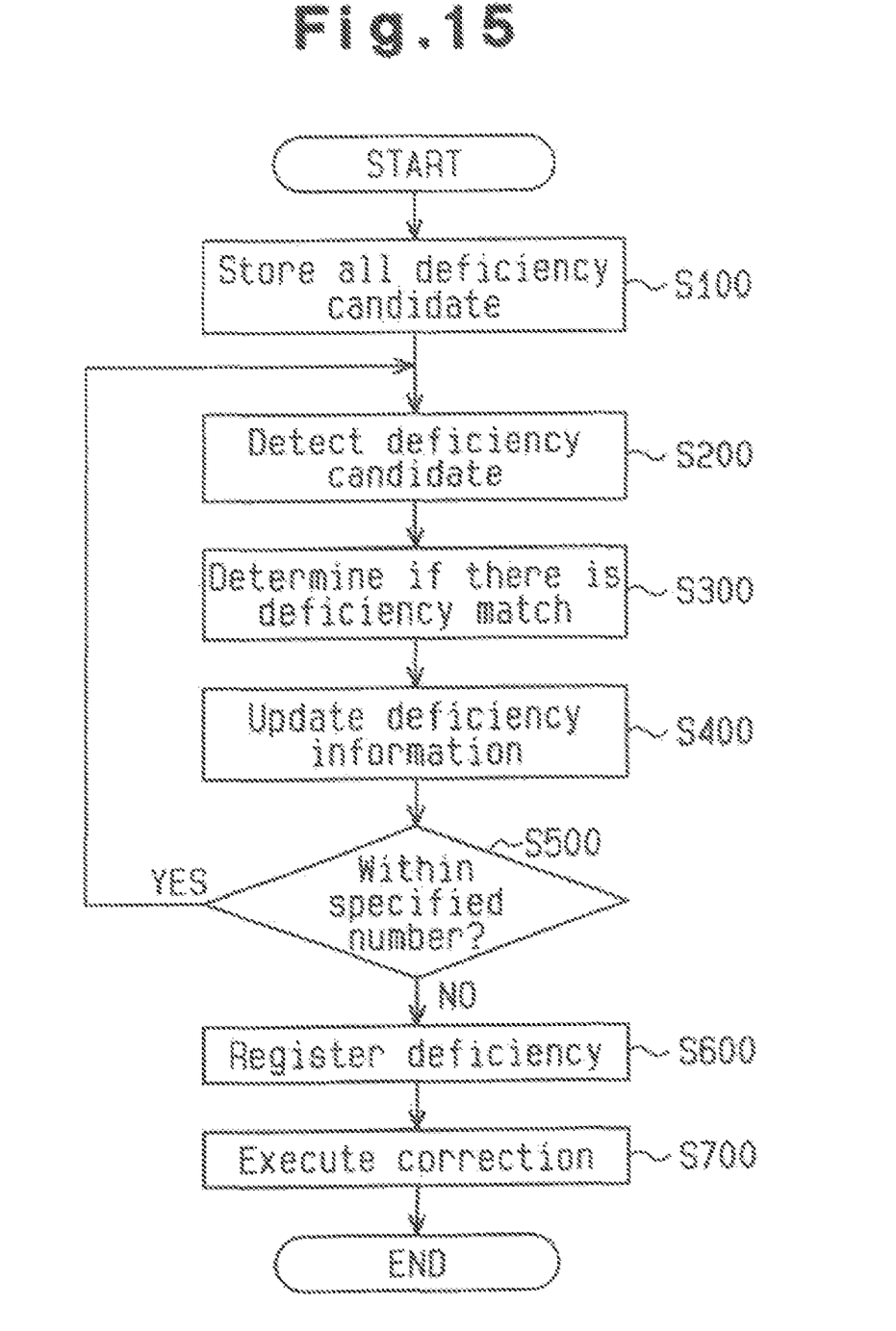
FIG. 15 is a flowchart for explaining a second deficient-pixel detection method according to the invention.

FIG. 15 is a flowchart for explaining a second deficient-pixel detection method according to the invention. The second deficient-pixel detection method is executed by the deficiency candidate detection circuit 12, the position memory circuit 13, the deficiency determining circuit 14, the deficiency registering circuit 15 and the deficiency correction circuit 16 in the image signal processor 10 (10A, 10B or 10C).

In step S100 in FIG. 15, the deficiency candidate detection circuit 12 detects a deficient pixel candidate on the initial screen (see FIG. 7), and stores pixel address information of all deficiency candidates on one screen (or a sub-area) in the position memory circuit 13.

In step S200, the deficiency determining circuit 14 detects a deficiency candidate on the next screen.

In subsequent step S300, the deficiency determining circuit 14 determines whether the pixel address of the deficiency candidate that has been detected in step S200 matches with the pixel address that is stored in the position memory circuit 13 in step S100.

In step S400, the deficiency determining circuit 14 updates the pixel address information of the deficiency candidate which is stored in the position memory circuit 13. This update causes only the address information which has been confirmed to have a match in step S300 to remain and delete the other address information which has not been confirmed to have a match.

Alternatively, in step S300, the deficiency determining circuit 14 may leave only the address information which has been confirmed to have a match consecutively for a predetermined number of times (the number of screens) or delete the other address information which has not been confirmed to have a match consecutively for a predetermined number of times (the number of screens). Whether to leave or delete the address information depends on whether or not to rewrite the information in the positron memory circuit 13.

In step S500, when the number of updates of the deficiency information lies within a predetermined specified number, the flow returns to step S200 and detection of a deficiency candidate is repeated. When the number of updates of the deficiency information reaches the predetermined specified number, the flow returns to step S600. Apparently, the deficiency determining circuit 14 determines a deficient pixel over plural screens.

In step S600, the address information stored in the position memory circuit 13 is fetched into the deficiency registering circuit 15, when in turn registers the address information of a real deficient pixel into the second memory 13b of the position memory circuit 13.

In step S700, the deficiency correction circuit 16 performs correction of the image signal of the pixel whose address is registered in the second memory 13b and generates the image signal Y'(n) with a deficiency correction.

The processes of steps S100 to S700 determine a deficient pixel from the conditions of pixels over a plurality of screens as well as from the conditions of one screen of pixels. This makes it possible to distinguish a real deficient pixel from an accidental deficient pixel which is due to the state of the subject.

The above-described embodiments may be modified in the following manner.

(1) The first and second threshold values Lw and Lb may be set in accordance with 14 peripheral pixels arranged in a matrix of 3 rows by 5 columns or 24 peripheral pixels arranged in a matrix of 5 rows by 5 columns.

(2) The deficiency determining circuit 14 may continue the deficiency determining operation over a plurality of fields and may stop operating together with the deficiency candidate detection circuit 12 after the position of a deficient pixel is determined.

(3) The deficiency determining circuit 14 may repeat the deficiency determining operation in a predetermined cycle.

Although the embodiment of the present invention have been described herein in conjunction with the accompanying drawings, the invention is not to be limited to the details given herein, but may be modified within the scope and equivalence of the appended claims.

What is claimed is:

1. An image signal processor for processing a plurality of image signals associated with a plurality of screens, comprising:
   an image memory circuit for storing a signal corresponding to a target pixel and signals corresponding to a plurality of peripheral pixels adjacent to the target pixel;
   a deficiency candidate detection circuit for comparing the signal corresponding to the target pixel with a threshold value calculated from the signals corresponding to the plurality of peripheral pixels to detect a deficient pixel candidate, and for generating a comparison result;
   a deficiency determining circuit for determining a deficient pixel according to a continuity of the deficient pixel candidate based on a plurality of comparison results over the plurality of screens;
   a position memory circuit for storing deficiency information of a position of the deficient pixel determined by the deficiency determining circuit; and
   a deficiency correction circuit for correcting the signal corresponding to the target pixel, which is deficient, in accordance with the deficiency information;
   wherein the deficiency determining circuit is configured to receive image pickup control information from an image pickup device for producing an image signal and is configured to determine a deficient pixel by using the image pickup control information and the threshold value.

2. The image signal processor according to claim 1, wherein the deficiency determining circuit is configured to receive the image pickup control information from the image pickup device, to estimate a luminance of a subject from the image pickup control information, and to determine a deficient pixel by using the threshold value when an estimated luminance of the subject is within a predetermined range.

3. The image signal processor according to claim 2, wherein the image pickup control information comprises one of exposure control information and gain control information.

4. The image signal processor according to claim 1, wherein the deficiency determining circuit is configured to change the threshold value in accordance with the image pickup control information.

5. The image signal processor according to claim 1, wherein the image pickup control information comprises focus control information, and wherein the deficiency determining circuit is configured to determine, initially, a deficiency using the focus control information before a focus of an optical system of an image pickup device is set.

6. A method of detecting a deficient pixel in a plurality of pixels associated with a plurality of screens, comprising:
   detecting a deficient pixel candidate by comparing a signal of a target pixel in one of the plurality of screens with a threshold value calculated from signals of a plurality of peripheral pixels adjacent to the target pixel;
   storing a position of the deficient pixel candidate;
   comparing, to the threshold value, a signal of a target pixel in another of the plurality of screens which corresponds to the position stored, thereby producing a comparison result;
   storing the comparison result;
   repeating the comparing and the storing a number of times over the plurality of screens;
   obtaining image pickup control information for producing an image signal; and
   detecting a deficient pixel in accordance with the image pickup control information and a plurality of comparison results obtained via the repeating.

7. The method according to claim 6, wherein the storing step comprises adding the image pickup control information to the plurality of comparison results and storing the image pickup control information and the plurality of comparison results.

8. The method according to claim 6, further comprising estimating a luminance of a subject from the image pickup control information, wherein the comparing is performed when an estimated luminance of the subject is within a predetermined range.

9. A method of detecting a deficient pixel in a plurality of pixels associated with a plurality of screens, comprising:
   detecting a deficient pixel candidate by comparing a signal of a target pixel in one of the plurality of screens with a threshold value set in accordance with signals of a plurality of peripheral pixels adjacent to the target pixel;
   storing a position of the deficient pixel candidate;
   comparing, to the threshold value, a signal of a target pixel in another of the plurality of screens which corresponds to the position stored, thereby producing a comparison result;
   storing the comparison result;
   repeating the comparing and the storing a number of times over the plurality of screens;
   obtaining image pickup control information for producing an image signal; and
   detecting a deficient pixel in accordance with the image pickup control information and a plurality of comparison results obtained via the repeating;
   wherein storing the comparison result comprises adding the image pickup control information to the plurality of comparison results and storing the image pickup control information and the plurality of comparison results.

* * * * *

UNITED STATES PATENT AND TRADEMARK OFFICE
CERTIFICATE OF CORRECTION

| | | |
|---|---|---|
| PATENT NO. | : 7,755,680 B2 | Page 1 of 1 |
| APPLICATION NO. | : 11/426754 | |
| DATED | : July 13, 2010 | |
| INVENTOR(S) | : Tohru Watanabe | |

It is certified that error appears in the above-identified patent and that said Letters Patent is hereby corrected as shown below:

In Claim 7, after "storing" delete "step".

Signed and Sealed this
Third Day of April, 2012

David J. Kappos
*Director of the United States Patent and Trademark Office*

UNITED STATES PATENT AND TRADEMARK OFFICE
CERTIFICATE OF CORRECTION

PATENT NO. : 7,755,680 B2  
APPLICATION NO. : 11/426754  
DATED : July 13, 2010  
INVENTOR(S) : Tohru Watanabe

Page 1 of 1

It is certified that error appears in the above-identified patent and that said Letters Patent is hereby corrected as shown below:

Column 14, line 36 (Claim 7, line 2) after "storing" delete "step".

This certificate supersedes the Certificate of Correction issued April 3, 2012.

Signed and Sealed this  
First Day of May, 2012

David J. Kappos  
*Director of the United States Patent and Trademark Office*